(12) United States Patent
Luo et al.

(10) Patent No.: US 11,359,692 B2
(45) Date of Patent: Jun. 14, 2022

(54) PIEZOELECTRIC SELF-POWERED COMBINATION BEAM VIBRATION DAMPER AND CONTROL METHOD THEREOF

(71) Applicants: Chongqing University, Shapingba (CN); Shanghai University, Shanghai (CN)

(72) Inventors: Jun Luo, Shanghai (CN); Dong Zhang, Shanghai (CN); Min Wang, Shanghai (CN); Huayan Pu, Shanghai (CN); Yi Sun, Shanghai (CN); Chaoqun Duan, Shanghai (CN); Shunqi Zhang, Shanghai (CN); Yan Peng, Shanghai (CN); Shaorong Xie, Shanghai (CN)

(73) Assignees: Chongqing University, Shapingba (CN); Shanghai University, Shanghai (CN)

( * ) Notice: Subject to any disclaimer, the term of this patent is extended or adjusted under 35 U.S.C. 154(b) by 427 days.

(21) Appl. No.: 16/686,449

(22) Filed: Nov. 18, 2019

(65) Prior Publication Data
US 2021/0088103 A1 Mar. 25, 2021

(30) Foreign Application Priority Data
Sep. 23, 2019 (CN) .......................... 201910898312.1

(51) Int. Cl.
*F16F 15/00* (2006.01)
*F16F 13/00* (2006.01)
(Continued)

(52) U.S. Cl.
CPC ............ *F16F 15/007* (2013.01); *F16F 13/00* (2013.01); *F16F 15/022* (2013.01); *H01L 41/042* (2013.01); *H01L 41/0825* (2013.01)

(58) Field of Classification Search
CPC ........ F16F 15/007; F16F 15/022; F16F 13/00; H01L 41/042; H01L 41/0825
See application file for complete search history.

(56) References Cited

U.S. PATENT DOCUMENTS

| 2014/0027601 A1* | 1/2014 | Bartel | H01L 41/1134 248/614 |
| 2016/0035964 A1* | 2/2016 | Storm | H01L 41/0973 310/317 |
| 2021/0091296 A1* | 3/2021 | Pu | F16F 15/03 |

FOREIGN PATENT DOCUMENTS

CN 107585066 A * 1/2018

* cited by examiner

Primary Examiner — Vishal R Sahni
(74) Attorney, Agent, or Firm — Harness, Dickey & Pierce, P.L.C.

(57) ABSTRACT

The present disclosure discloses a piezoelectric self-powered combination beam vibration damper and a control method thereof. An upper guiding component is installed inside an upper rigid frame, a lower guiding component is installed inside a lower rigid component, a guide rod is nested inside the upper guiding component and the lower guiding component, an upper elastic component is sleeved outside the upper idler wheel mechanism, a lower elastic component is sleeved outside the lower idler wheel mechanism, one end of each piezoelectric cantilever beam is fixed between the upper rigid frame and the lower rigid frame, the other end of each piezoelectric cantilever beam is arranged between the upper idler wheel mechanism and the lower idler wheel mechanism, at least one piezoelectric cantilever beam is connected with the input end of a circuit system, and other piezoelectric cantilever beams are connected with the output end of the circuit system.

14 Claims, 8 Drawing Sheets

(51) Int. Cl.
*F16F 15/02* (2006.01)
*H01L 41/04* (2006.01)
*H01L 41/08* (2006.01)

PIEZOELECTRIC SELF-POWERED COMBINATION BEAM VIBRATION DAMPER AND CONTROL METHOD THEREOF

CROSS-REFERENCE TO RELATED APPLICATIONS

This application claims priority to Chinese application number 201910898312.1, filed Sep. 23, 2019 with a title of Piezoelectric Self-Powered Combination Beam Vibration Damper And Control Method Thereof. The above-mentioned patent application is incorporated herein by reference in its entirety.

FIELD

The present disclosure relates to the technical field of vibration abatement, and in particular, to a piezoelectric self-powered combination beam vibration damper and a control method thereof.

BACKGROUND

A piezoelectric material has a direct piezoelectric effect and an inverse piezoelectric effect simultaneously. Piezoelectric energy harvesting can be realized by using the direct piezoelectric effect of the piezoelectric material, due to the fact that the piezoelectric material has the advantages of high energy density, high electro-mechanical transformation efficiency, low cost, simple system structure, no electromagnetic interference, easy implementation for minimization of the system, easy integration, no pollution and the like. The piezoelectric material is widely researched in the aspect of energy collection, particularly vibration energy collection based on cantilever beams. The piezoelectric material can serve as an actuator by using the inverse piezoelectric effect of the piezoelectric material, due to the fact that the piezoelectric material is high in control accuracy and high in dynamic response. The piezoelectric material is widely applied in the vibration control of a thin-walled structure, and main research still focuses on the vibration control of cantilever beams at present.

Passive control of piezoelectric cantilever beams is simple in system and easy to implement, but the control performance is relatively low. Active control has a preferable control effect, but external equipment such as a sensor and a power amplifier is needed in general. The system is complex and huge. Simultaneously, an extra power supply is needed, and the system is extremely difficult to use in practice.

So far, the research on the aspects of vibration energy collection and vibration control based on the piezoelectric cantilever beams are relatively mature, but energy obtained by piezoelectric energy harvesting is still not preferably applied. However, due to the restriction of the structures of the piezoelectric cantilever beams, the vibration control based on the piezoelectric cantilever beams is restricted in the stage of laboratory investigation and is extremely difficult to move towards actual application.

SUMMARY

In order to solve the technical problem, the present disclosure provides a piezoelectric self-powered combination beam vibration damper and a control method thereof. The piezoelectric self-powered combination beam vibration damper is small in structure and self-powered completely. The energy is utilized sufficiently. The structure defect of a single beam is overcome, and the research on piezoelectric cantilever beams is applied in practice.

To achieve the above purpose, the present disclosure provides the following technical solutions.

A piezoelectric self-powered combination beam vibration damper includes a loading platform, a guide rod, an upper rigid frame, a lower rigid frame, an upper guiding component, a lower guiding component, an upper elastic component, a lower elastic component, an upper idler wheel mechanism, a lower idler wheel mechanism, a circuit system and a plurality of piezoelectric cantilever beams, where the upper rigid frame is arranged at the upper part of the lower rigid frame, the upper guiding component is installed inside the upper rigid frame, the lower guiding component is installed inside the lower rigid component, the guide rod is nested inside the upper guiding component and the lower guiding component, the loading platform is fixed to the upper end of the guide rod, the upper idler wheel mechanism and the lower idler wheel mechanism are fixedly sleeved on the guide rod and are positioned between the upper guiding component and the lower guiding component respectively, the upper elastic component is sleeved outside the upper idler wheel mechanism, the lower elastic component is sleeved outside the lower idler wheel mechanism, one end of each piezoelectric cantilever beam is fixed between the upper rigid frame and the lower rigid frame, the other end of each piezoelectric cantilever beam is arranged between the upper idler wheel mechanism and the lower idler wheel mechanism, at least one piezoelectric cantilever beam of the piezoelectric cantilever beams is connected with the input end of the circuit system, and other piezoelectric cantilever beams of the piezoelectric cantilever beams are connected with the output end of the circuit system.

Preferably, the piezoelectric self-powered combination beam vibration damper further includes a gasket, the gasket is sleeved on the guide rod, and the gasket is positioned between the lower guiding component and the lower elastic component.

Preferably, the circuit system includes a rectifying circuit, a DC-DC voltage conversion circuit, an energy storage circuit, a control circuit and a charging battery, at least one piezoelectric cantilever beam of the piezoelectric cantilever beams is connected with the input end of the rectifying circuit, the output end of the rectifying circuit is connected with the input end of the DC-DC voltage conversion circuit, the output end of the DC-DC voltage conversion circuit is connected with the input ends of the energy storage circuit and the charging battery, the output end of the energy storage circuit is connected with the input end of the control circuit, other piezoelectric cantilever beams of the piezoelectric cantilever beams are connected with the output end of the control circuit, and the charging battery is used for supplying power for the rectifying circuit, the DC-DC voltage conversion circuit, the energy storage circuit and the control circuit.

Preferably, each piezoelectric cantilever beam includes a piezoelectric plate, a flexible plate and a rigid plate, one end of each flexible plate is fixed between the upper rigid frame and the lower rigid frame, the other end of each flexible plate is fixedly connected with the corresponding rigid plate, the rigid plates are arranged between the upper idler wheel mechanism and the lower idler wheel mechanism, and each piezoelectric plate is pasted onto the corresponding flexible plate.

Preferably, the upper idler wheel mechanism includes an upper idler wheel support, a plurality of upper wheel axles and a plurality of upper idler wheels, the upper idler wheel support includes an upper cylinder and a plurality of upper supports, the upper idler wheel support is of an integral structure, the upper cylinder is fixedly sleeved on the guide rod, one end of each upper support is arranged at the lower part of the upper cylinder, the corresponding upper wheel axle is installed at the other end of each upper support, the corresponding upper idler wheel is installed on each upper wheel axle, and each upper idler wheel is in contact with the upper surface of the corresponding rigid plate; the lower idler wheel mechanism includes a lower idler wheel support, a plurality of lower wheel axles and a plurality of lower idler wheels, the lower idler wheel support includes a lower cylinder and a plurality of lower supports, the lower idler wheel support is of an integral structure, the lower cylinder is fixedly sleeved on the guide rod, one end of each lower support is arranged at the upper part of the lower cylinder, the corresponding lower wheel axle is installed at the other end of each lower support, the corresponding lower idler wheel is installed on each lower wheel axle, and each lower idler wheel is in contact with the lower surface of the corresponding rigid plate.

Preferably, the upper guiding component and the lower guiding component are linear bearings respectively.

Preferably, the upper elastic component and the lower elastic component are reset springs respectively.

A control method of the piezoelectric self-powered combination beam vibration damper is provided, where the control method includes the following steps: energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, where the piezoelectric cantilever beams connected with the input end of the circuit system are used for energy collection, the piezoelectric cantilever beams connected with the output end of the circuit system are used for vibration control, when the voltage generated by the piezoelectric cantilever beams used for energy collection reaches a maximum value or a minimal value, the circuit system is conducted, and the energy stored by the circuit system is used for vibration control of the piezoelectric cantilever beams connected with the output end of the circuit system.

Compared with the prior art, the present disclosure has the following technical effects:

According to the piezoelectric self-powered combination beam vibration damper and the control method thereof provided by the disclosure, at least one piezoelectric cantilever beam of the piezoelectric cantilever beams is connected with the input end of the circuit system, and is used for energy collection. Other piezoelectric cantilever beams of the piezoelectric cantilever beams are connected with the output end of the circuit system and are used for vibration control, piezoelectric energy harvesting and vibration control are realized simultaneously by using a piezoelectric effect and piezoelectric inverse effect. The whole device does not need external power supply and is self-powered completely, and the energy is utilized sufficiently. A coupling relationship does not exist among the piezoelectric cantilever beams. The piezoelectric cantilever beams can be controlled independently and also can be matched with one another. The structure defect of the single beam is overcome, and the theoretical research on the piezoelectric vibration control of the piezoelectric cantilever beams can be sufficiently utilized in practice through the combined mechanism.

BRIEF DESCRIPTION OF THE DRAWINGS

To describe the technical solutions in the embodiments of the present disclosure or in the prior art more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

Figure 1:
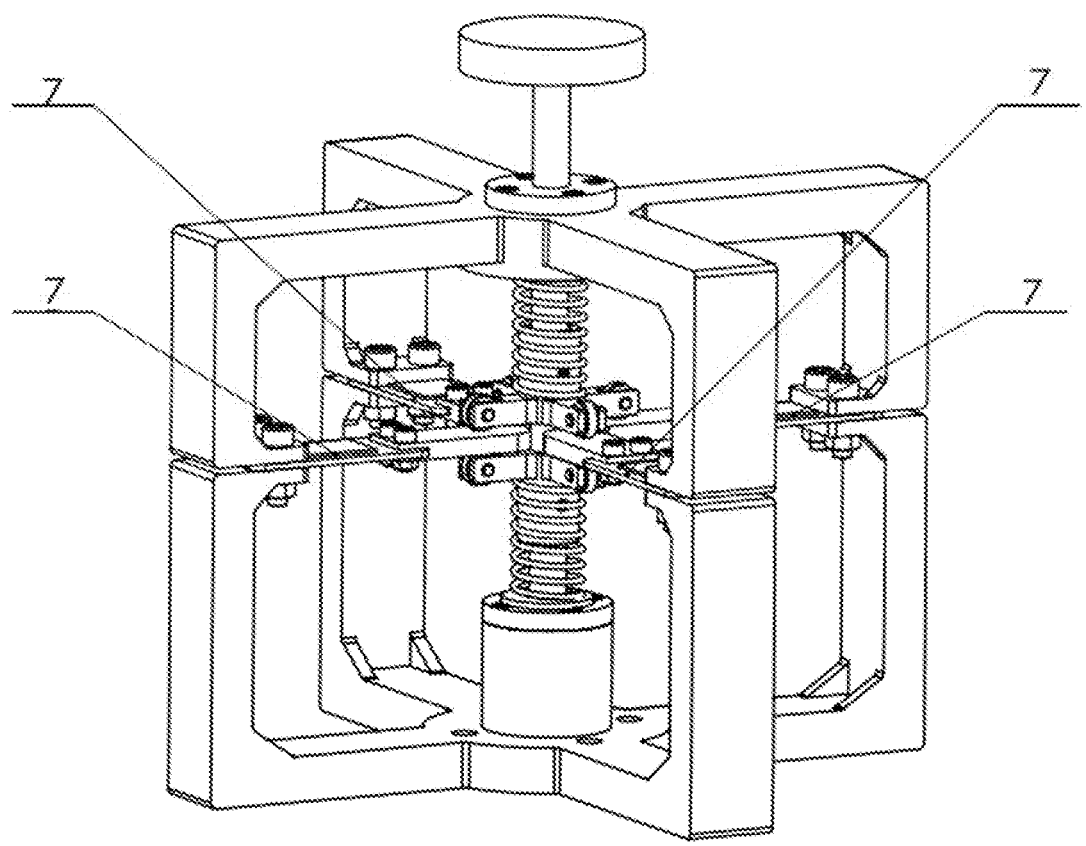
FIG. 1 is a stereoscopic structure diagram of a piezoelectric self-powered combination beam vibration damper provided by the present disclosure.
Figure 2:
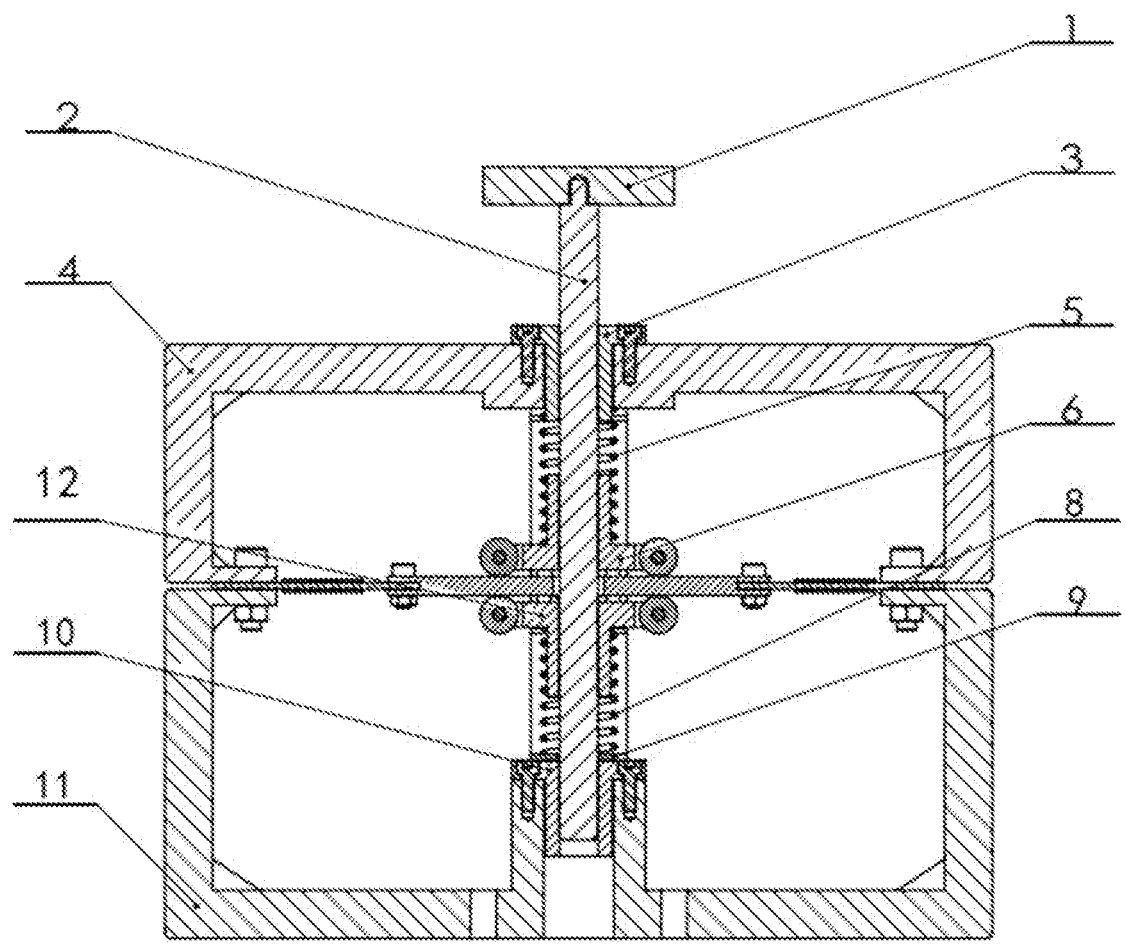
FIG. 2 is a section view of the piezoelectric self-powered combination beam vibration damper provided by the present disclosure.
Figure 3:
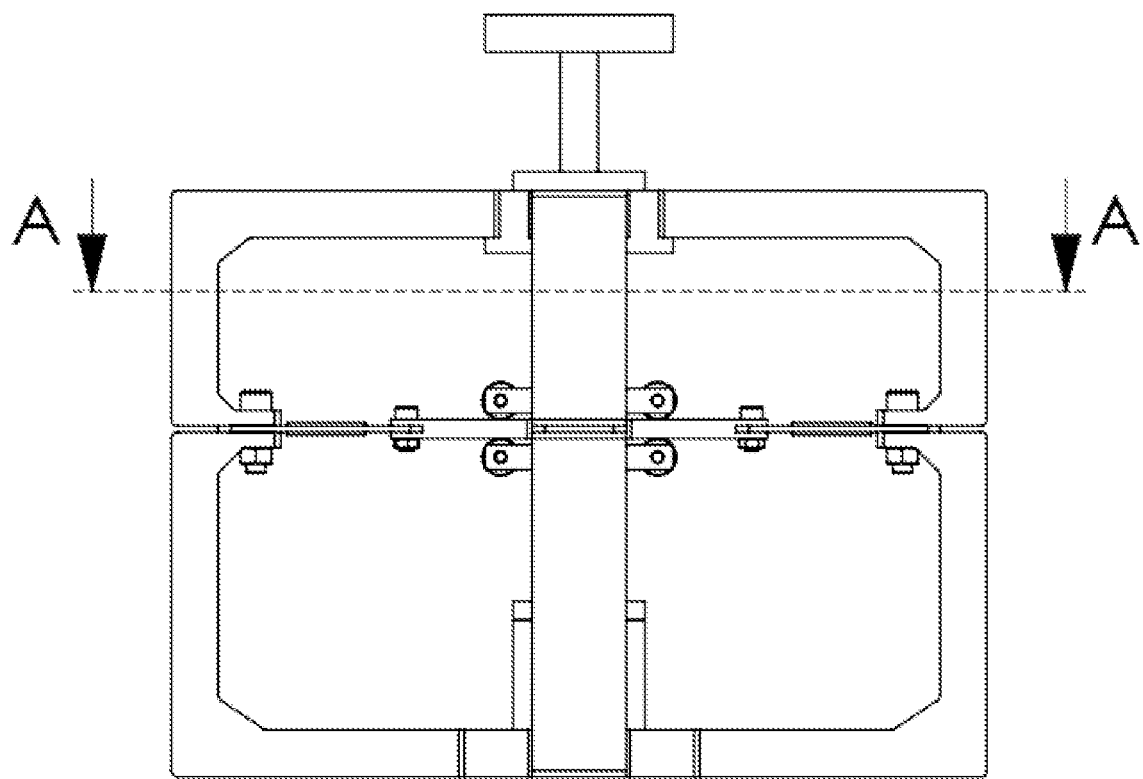
FIG. 3 is a front view of the piezoelectric self-powered combination beam vibration damper provided by the present disclosure.
Figure 4:
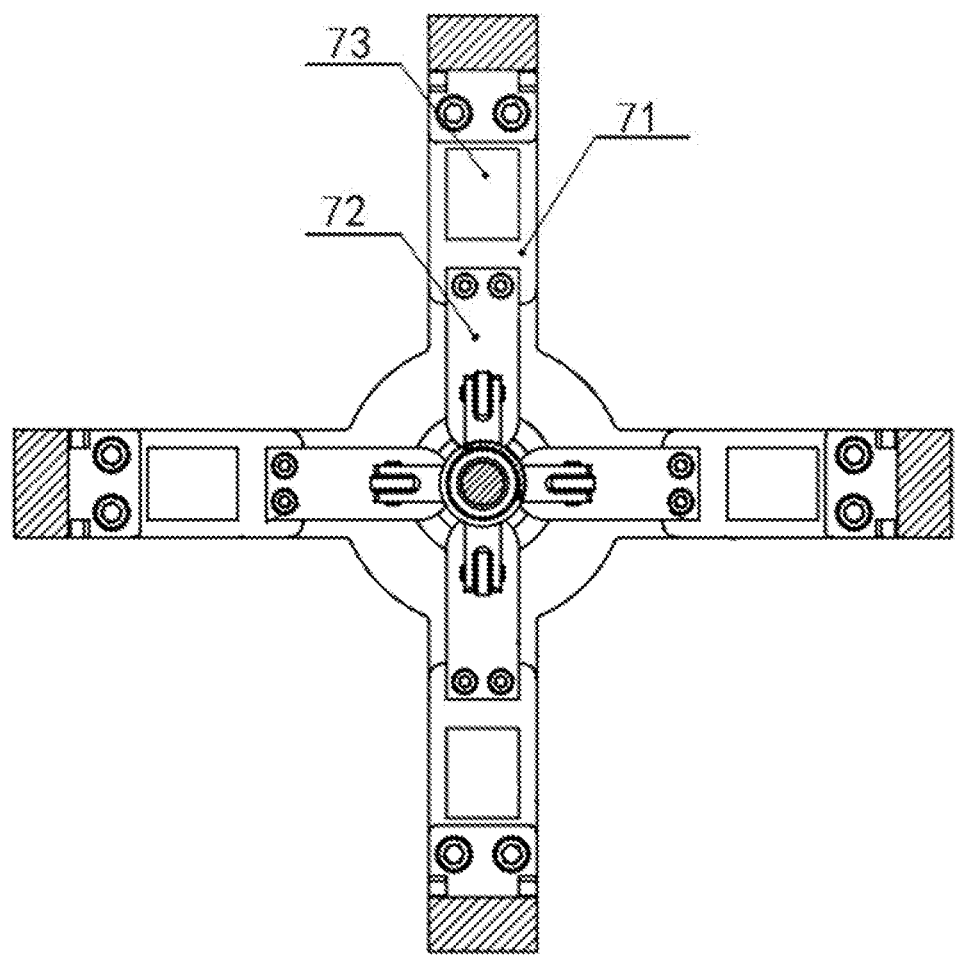
FIG. 4 is a section view in A-A direction in FIG. 3.
Figure 5:
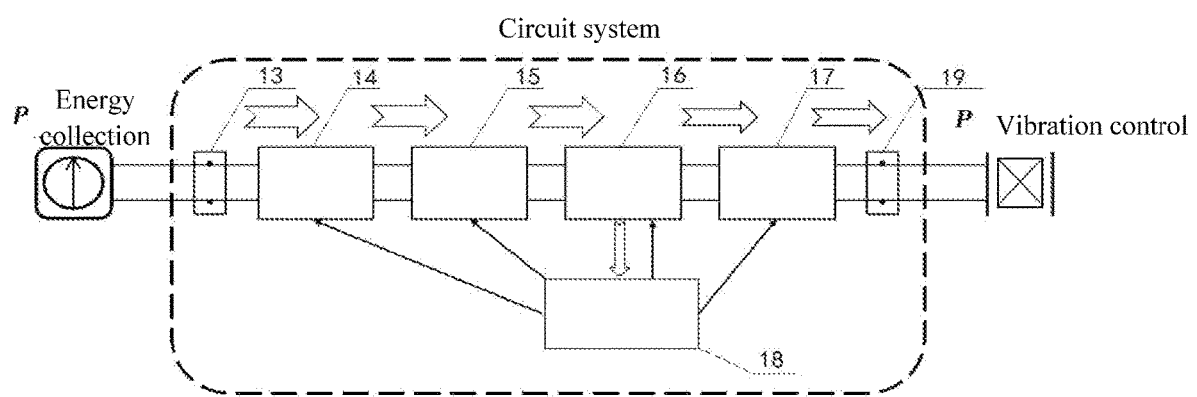
FIG. 5 is a connection schematic diagram of a circuit system in the present disclosure.
Figure 6:
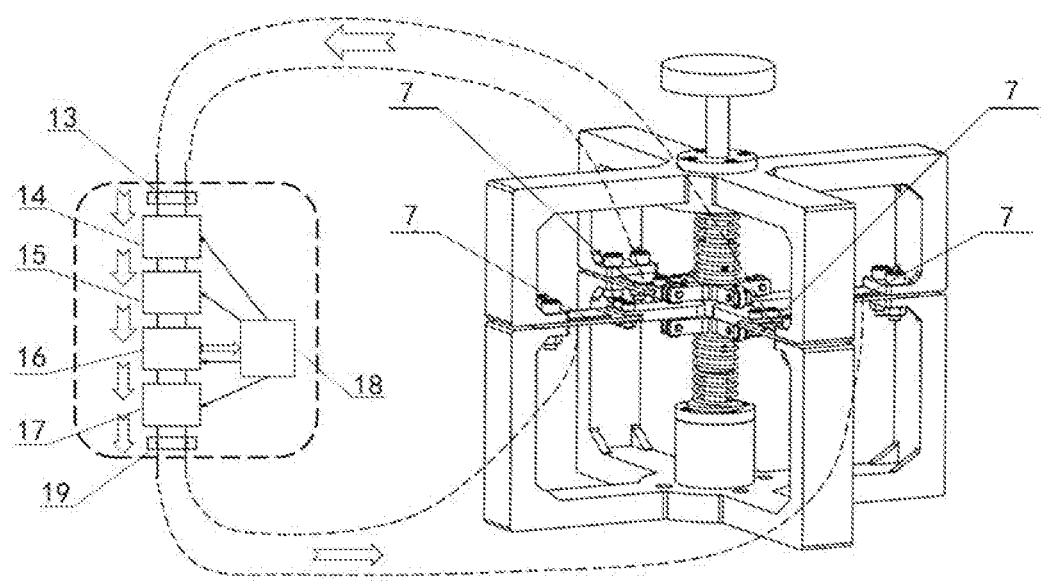
FIG. 6 is a schematic diagram of the piezoelectric self-powered combination beam vibration damper provided by the present disclosure.

Description of attached drawing marks: 1, loading platform; 2, guide rod; 3, upper guiding component; 4, upper rigid frame; 5, upper elastic component; 6, upper idler wheel mechanism; 7, piezoelectric cantilever beam; 71, flexible plate; 72, rigid plate; 73, piezoelectric plate; 8, lower elastic component; 9, gasket; 10, lower guiding component; 11, lower rigid frame; 12, lower idler wheel mechanism; 13, first plug connector; 14, rectifying circuit; 15, DC-DC voltage conversion circuit; 16, energy storage circuit; 17, control circuit; 18, charging battery; and 19, second plug connector.

DETAILED DESCRIPTION

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

The present disclosure aims to provide a piezoelectric self-powered combination beam vibration damper and a control method thereof. The piezoelectric self-powered combination beam vibration damper is small in structure and self-powered completely, the energy is utilized sufficiently, the structure defect of a single beam is overcome, and the research on piezoelectric cantilever beams is applied in practice.

To make the foregoing objective, features, and advantages of the present disclosure clearer and more comprehensible, the present disclosure is further described in detail below with reference to the accompanying drawings and specific embodiments.

As shown in FIG. 1 to FIG. 6, a piezoelectric self-powered combination beam vibration damper provided by the embodiment includes a loading platform 1, a guide rod 2, an upper rigid frame 4, a lower rigid frame 11, an upper guiding component 3, a lower guiding component 10, an upper elastic component 5, a lower elastic component 8, an upper idler wheel mechanism 6, a lower idler wheel mechanism 12, a circuit system and a plurality of piezoelectric cantilever beams 7. The upper rigid frame 4 is arranged at the upper part of the lower rigid frame 11. The upper guiding component 3 is installed inside the upper rigid frame 4. The lower guiding component 10 is installed inside the lower rigid component, specifically. The upper guiding component 3 is fixed onto the upper rigid frame 4 through screws. The lower guiding component 10 is fixed onto the rigid frame 11 through screws. The upper guiding component 3 and the lower guiding component 10 are linear bearings respectively. The guide rod 2 is nested in the upper guiding component 3 and the lower guiding component 10. The guide rod 2 is restricted by the upper guiding component 3 and the lower guiding component 10 so that the guide rod 2 only can perform a vertical motion. The loading platform 1 is fixed to the upper end of the guide rod 2, and specifically, the loading platform 1 is in threaded connection with the guide rod 2. The upper idler wheel mechanism 6 and the lower idler wheel mechanism 12 are fixedly sleeved on the guide rod 2 and are positioned between the upper guiding component 3 and the lower guiding component 10. The upper elastic component 5 is sleeved outside the upper idler wheel mechanism 6. The upper elastic component 5 is arranged between the upper rigid frame 4 and the upper idler wheel mechanism 6, the lower elastic component 8 is sleeved outside the lower idler wheel mechanism. The lower elastic component 8 is arranged between the lower rigid frame 11 and the lower idler wheel mechanism 12, and specifically, the upper elastic component 5 and the lower elastic component 8 are reset springs respectively. One end of each piezoelectric cantilever beam 7 is fixed between the upper rigid frame 4 and the lower rigid frame 11, and the other end of each piezoelectric cantilever beam 7 is arranged between the upper idler wheel mechanism 6 and the lower idler wheel mechanism 12, so that the piezoelectric cantilever beams 7 are restricted to move in a single degree of freedom in the vertical direction. The wasted energy of flutter on other modes is reduced, at least one piezoelectric cantilever beam 7 of the piezoelectric cantilever beams 7 is connected with the input end of the circuit system, and other piezoelectric cantilever beams 7 of the piezoelectric cantilever beams 7 are connected with the output end of the circuit system.

The piezoelectric self-powered combination beam vibration damper in the embodiment can be used for vibration resistance and also can be used for vibration isolation. The two ways are different in application only. But, overall workflows are similar, and thus only the mode of vibration resistance is described in detail here. At least one piezoelectric cantilever beam 7 of the piezoelectric cantilever beams 7 is connected with the input end of the circuit system, and is used for energy collection. Other piezoelectric cantilever beams 7 of the piezoelectric cantilever beams 7 are connected with the output end of the circuit system and are used for vibration control. Piezoelectric energy harvesting and vibration control are realized simultaneously by using a piezoelectric effect and piezoelectric inverse effect, the whole device does not need external power supply and is self-powered completely, and the energy is utilized sufficiently. A coupling relationship does not exist among the piezoelectric cantilever beams 7, the piezoelectric cantilever beams 7 can be controlled independently and also can be matched with one another. The structure defect of the single beam is overcome, and the theoretical research on the piezoelectric vibration control of the piezoelectric cantilever beams 7 can be sufficiently utilized in practice through the combined mechanism. The piezoelectric cantilever beams 7 can realize passive vibration control as a whole body, also can be used in pairs to realize semi-active vibration control (namely a control method in the embodiment), and also can be independent from one another to realize active cooperative control, so that vibration control can be realized flexibly according to different technical requirements.

The piezoelectric self-powered combination beam vibration damper in the embodiment further includes a gasket 9. The gasket 9 is sleeved on the guide rod 2, the gasket 9 is positioned between the lower guiding component 10 and the lower elastic component 8, and the piezoelectric cantilever beams 7 can always remain at a horizontal balance position in the static balance state of different loadings by adjusting the gasket 9.

Each piezoelectric cantilever beam 7 includes a piezoelectric plate 73, a flexible plate 71 and a rigid plate 72. One end of each flexible plate 71 is fixed between the upper rigid frame 4 and the lower rigid frame 11. The other end of each flexible plate 71 is fixedly connected with the corresponding rigid plate 72. Specifically, the upper rigid frame 4 and the lower rigid frame 11 are connected through bolts. The flexible plates 71 of the piezoelectric cantilever beams 7 are locked in the upper rigid frame 4 and the lower rigid frame 11. The rigid plate 72 of each piezoelectric cantilever beam 7 is connected with the corresponding flexible plate 71 through bolts, the rigid plates 72 are arranged between the upper idler wheel mechanism 6 and the lower idler wheel mechanism 12, and each piezoelectric plate 73 is pasted onto the corresponding flexible plate 71. In the specific embodiment, each piezoelectric cantilever beam 7 includes two piezoelectric plates 73, the two piezoelectric plates 73 are adhered onto the upper surface and the lower surface of the corresponding flexible plate 71 respectively. The piezoelectric plates 73 are arranged at the position close to the clamping end and are symmetric about the neutral axis of the corresponding flexible plate 71. Specifically, a plurality of piezoelectric plates 73 further can be adhered according to requirements.

The circuit system includes a rectifying circuit 14, a DC-DC voltage conversion circuit 15, an energy storage circuit 16, a control circuit 17 and a charging battery. At least one piezoelectric cantilever beam 7 of the piezoelectric cantilever beams 7 is connected with the input end of the rectifying circuit 14. The piezoelectric cantilever beams 7 are used for energy collection. The piezoelectric plates 73 of the piezoelectric cantilever beams 7 used for energy collection are connected with the input end of the rectifying circuit 14 through first plug connectors 13. The output end of the rectifying circuit 14 is connected with the input end of the DC-DC voltage conversion circuit 15. The output end of the DC-DC voltage conversion circuit 15 is connected with the input ends of the energy storage circuit 16 and the charging battery 18. The output end of the energy storage circuit 16 is connected with the input end of the control circuit 17. Other piezoelectric cantilever beams 7 of the piezoelectric cantilever beams 7 are connected with the output end of the control circuit 17. The piezoelectric cantilever beams 7 are used for vibration control. The piezoelectric plates 73 of the piezoelectric cantilever beams 7 used for vibration control are connected with the output end of the control circuit 17 through second plug connectors 19. A part of energy stored by the energy storage circuit 16 is used for vibration control of the piezoelectric cantilever beams 7. The other part of the energy stored by the energy storage circuit 16 is used for supplying power for the charging battery 18. The charging battery 18 is used for supplying power for the rectifying circuit 14, the DC-DC voltage conversion circuit 15, the energy storage circuit 16 and the control circuit 17. Specifically, all modules in the circuit system are integrated into one circuit board respectively.

The upper idler wheel mechanism 6 includes an upper idler wheel support, a plurality of upper wheel axles and a plurality of upper idler wheels. The upper idler wheel support includes an upper cylinder and a plurality of upper supports. The upper idler wheel support is of an integral structure, the upper support. The upper wheel axles, the upper idler wheel and the rigid plates 72 are of a one-to-one corresponding relation. The upper cylinder is fixedly sleeved on the guide rod 2 specifically. Axial fixation of the upper cylinder is realized through stopper screws, one end of each upper support is arranged at the lower part of the upper cylinder, a plurality of upper supports are uniformly distributed along the circumferential direction of the upper cylinder, the corresponding upper wheel axle is installed at the other end of each upper support. The corresponding upper idler wheel is installed on each upper wheel axle. Each upper idler wheel is in contact with the upper surface of the corresponding rigid plate 72. The lower idler wheel mechanism 12 includes a lower idler wheel support, a plurality of lower wheel axles and a plurality of lower idler wheels. The lower idler wheel support includes a lower cylinder and a plurality of lower supports. The lower idler wheel support is of an integral structure, the lower support. The lower wheel axles, the lower idler wheel and the rigid plates 72 are of a one-to-one corresponding relation. The lower cylinder is fixedly sleeved on the guide rod 2. Specifically, axial fixation of the lower cylinder is realized through stopper screws. One end of each lower support is arranged at the upper part of the lower cylinder. A plurality of upper supports are uniformly distributed along the circumferential direction of the upper cylinder. The corresponding lower wheel axle is installed at the other end of each lower support. The corresponding lower idler wheel is installed on each lower wheel axle. Each lower idler wheel is in contact with the lower surface of the corresponding rigid plate 72.

In the specific embodiment, four piezoelectric cantilever beams 7 are arranged and are uniformly distributed along the circumferential direction of the guide rod 2. Namely, the four piezoelectric cantilever beams 7 are arranged symmetrically in pairs, where the piezoelectric plates 73 on one group of piezoelectric cantilever beams 7 arranged symmetrically are used for energy collection, and the piezoelectric plates 73 on the other group of piezoelectric cantilever beams 7 arranged symmetrically are used for vibration control.

The embodiment further provides a control method of the piezoelectric self-powered combination beam vibration damper. The control method includes the following steps: energy is input to the system when the loading platform 1 is excited by an external environment. The energy is transferred to the upper idler wheel mechanism 6 and the lower idler wheel mechanism 12 through the guide rod 2. Then, the energy is transferred to the piezoelectric cantilever beams 7. The piezoelectric cantilever beams 7 are forced to be vibrated. Bending strain occurs, the strain at the clamping end is maximum. The piezoelectric plates 73 are also strained accordingly here, and electric charges are generated due to a piezoelectric effect. When the deformation of the piezoelectric plates 73 used for energy collection reaches the maximum value, namely, the generated voltage reaches a maximum value or a minimal value, the circuit system is conducted and begins to work. Firstly, the rectifying circuit 14 is used for converting energy converted alternating current into direct current. The DC-DC voltage conversion circuit 15 is used for realizing matching with the voltage of a subsequent circuit through voltage conversion. The energy storage circuit 16 is used for completing the storage of energy. After the storage is completed, the control circuit 17 is used for enabling stored energy to be used for vibration control of the piezoelectric plates 73 through a switching control law. Namely, the deformation of the piezoelectric cantilever beams 7 is restricted all the time by force generated by voltage output to the piezoelectric plates 73 used for vibration control. Simultaneously, the switch of an energy collecting circuit is switched off in the period of vibration control. The vibration control is completed. The circuit of the system resets to complete a control cycle, and the charging battery 18 can be used for obtaining partially converted energy and supplying power for the rectifying circuit 14, the DC-DC voltage conversion circuit 15, the energy storage circuit 16 and the control circuit 17.

Figure 7:
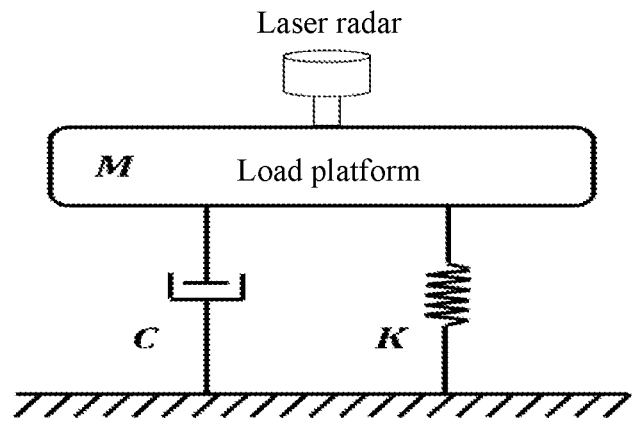
FIG. 7 is a passive vibration damping schematic diagram of the piezoelectric self-powered combination beam vibration damper (pure structure) provided by the present disclosure.

The vibration damping of a high-precision laser radar sensor is taken as an example, and passive and semi-active control vibration damping principles in the embodiment are contrasted:

As shown in FIG. 7, the vibration damping mechanism of the passive vibration damping system in the embodiment is composed of an inherent spring-mass-damping unit of the system, and the transmissibility curve function G is as shown in the specification:

$$G = \frac{x_1}{x_0} = \frac{Cs + K}{Ms^2 + Cs + K}$$

In the formula, $x_1$ is the vibration displacement of the loading platform 1, $x_0$ is shock excitation amplitude, C is the equivalent damping of the system, K is the equivalent stiffness of the system, M is the mass of the loading platform 1, $s=j\omega$ is the complex variable of Laplace transform, and $\omega$ is a frequency domain coefficient.

Figure 8:
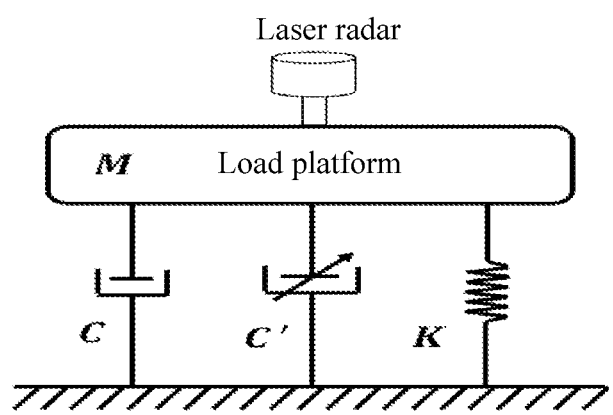
FIG. 8 is a semi-active vibration damping schematic diagram of the piezoelectric self-powered combination beam vibration damper provided by the present disclosure.

As shown in FIG. 8, the corresponding transmissibility curve function G0 of the schematic diagram, under semi-active vibration damping, of the device in the embodiment is as shown in the specification:

$$G_0 = \frac{x_2}{x_0} = \frac{C_0 s + K}{Ms^2 + C_0 s + K}, C_0 = C + C'$$

In the formula, $x_2$ is the vibration displacement of the loading platform 1, under semi-active vibration damping, of the device in the embodiment, $C_0$ is the equivalent damping of the system when semi-active control is carried out on the device in the embodiment, and C' is additional damping after piezoelectric control is added to the device in the embodiment.

Figure 9:
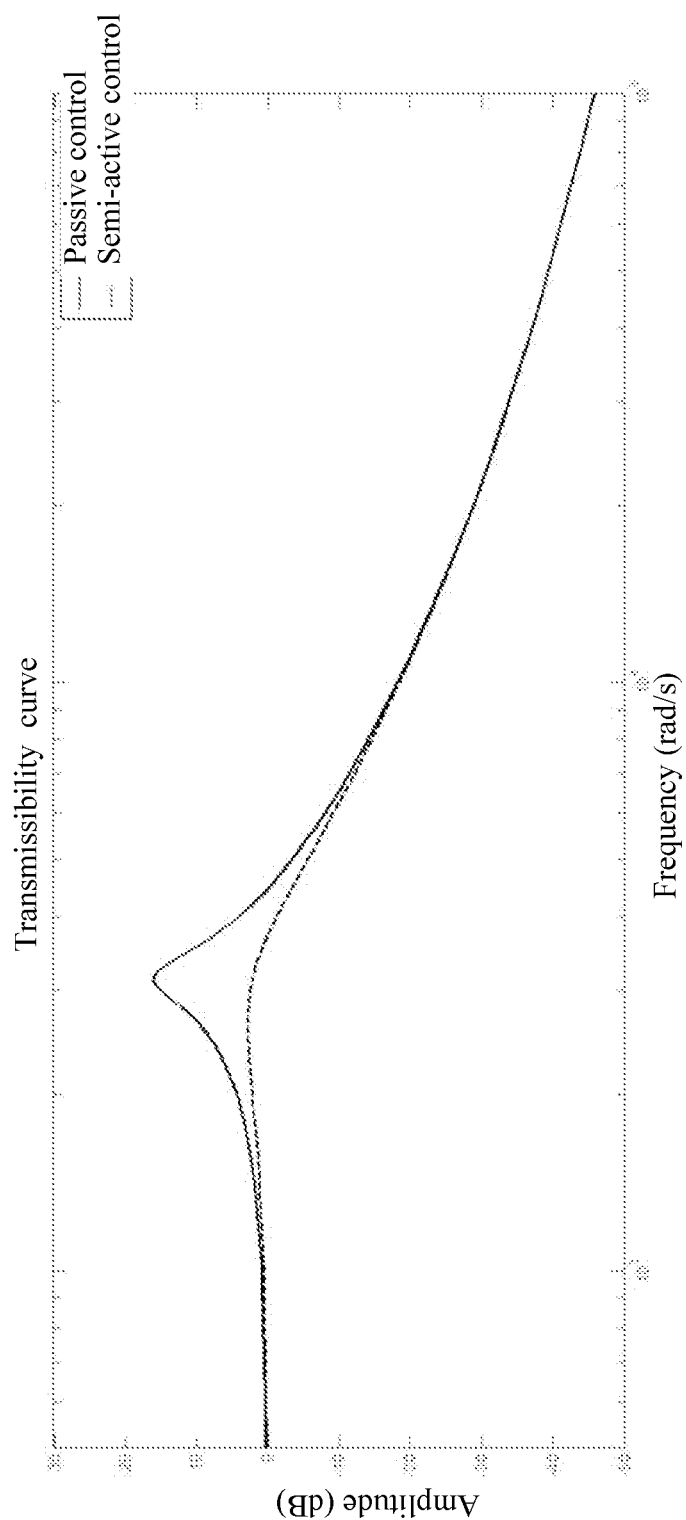
FIG. 9 is a transmissibility curve comparison diagram under two conditions in FIG. 7 and FIG. 8.

FIG. 9 is a transmissibility curve diagram under two conditions in FIG. 7 and FIG. 8. It is observed that the transmissibility of the system is of a higher peak value at the positions of resonance peaks under passive vibration damping condition from full lines in the figures, so that the vibration damping effect near the resonance frequency is poor. It is observed that the resonance peak value of the system is obviously improved due to the fact that the additional damping is introduced into piezoelectric energy harvesting and vibration control when a semi-active control method is adopted.

Several examples are used for illustration of the principles and implementation methods of the present disclosure. The description of the embodiments is used to help illustrate the method and its core principles of the present disclosure. In addition, those skilled in the art can make various modifications in terms of specific embodiments and scope of application in accordance with the teachings of the present disclosure. In conclusion, the content of this specification shall not be construed as a limitation to the disclosure.

What is claimed is:

1. A piezoelectric self-powered combination beam vibration damper, comprising:
   a loading platform;
   a guide rod;
   an upper rigid frame;
   a lower rigid frame;
   an upper guiding component;
   a lower guiding component;
   an upper elastic component;
   a lower elastic component;
   an upper idler wheel mechanism;
   a lower idler wheel mechanism; and
   a circuit system and a plurality of piezoelectric cantilever beams,
   wherein the upper rigid frame is arranged at the upper part of the lower rigid frame, the upper guiding component is installed inside the upper rigid frame, the lower guiding component is installed inside the lower rigid component, the guide rod is nested inside the upper guiding component and the lower guiding component, the loading platform is fixed to the upper end of the guide rod, the upper idler wheel mechanism and the lower idler wheel mechanism are fixedly sleeved on the guide rod and are positioned between the upper guiding component and the lower guiding component respectively, the upper elastic component is sleeved outside the upper idler wheel mechanism, the lower elastic component is sleeved outside the lower idler wheel mechanism, one end of each piezoelectric cantilever beam is fixed between the upper rigid frame and the lower rigid frame, the other end of each piezoelectric cantilever beam is arranged between the upper idler wheel mechanism and the lower idler wheel mechanism, at least one piezoelectric cantilever beam of the piezoelectric cantilever beams is connected with the input end of the circuit system, and other piezoelectric cantilever beams of the piezoelectric cantilever beams are connected with the output end of the circuit system.

2. The piezoelectric self-powered combination beam vibration damper according to claim 1, wherein the piezoelectric self-powered combination beam vibration damper further comprises a gasket, the gasket is sleeved on the guide rod, and the gasket is positioned between the lower guiding component and the lower elastic component.

3. The piezoelectric self-powered combination beam vibration damper according to claim 1, wherein the circuit system comprises a rectifying circuit, a DC-DC voltage conversion circuit, an energy storage circuit, a control circuit and a charging battery, at least one piezoelectric cantilever beam of the piezoelectric cantilever beams is connected with the input end of the rectifying circuit, the output end of the rectifying circuit is connected with the input end of the DC-DC voltage conversion circuit, the output end of the DC-DC voltage conversion circuit is connected with the input ends of the energy storage circuit and the charging battery, the output end of the energy storage circuit is connected with the input end of the control circuit, other piezoelectric cantilever beams of the piezoelectric cantilever beams are connected with the output end of the control circuit, and the charging battery is used for supplying power for the rectifying circuit, the DC-DC voltage conversion circuit, the energy storage circuit and the control circuit.

4. The piezoelectric self-powered combination beam vibration damper according to claim 1, wherein each piezoelectric cantilever beam comprises a piezoelectric plate, a flexible plate and a rigid plate, one end of each flexible plate is fixed between the upper rigid frame and the lower rigid frame, the other end of each flexible plate is fixedly connected with the corresponding rigid plate, the rigid plates are arranged between the upper idler wheel mechanism and the lower idler wheel mechanism, and each piezoelectric plate is pasted onto the corresponding flexible plate.

5. The piezoelectric self-powered combination beam vibration damper according to claim 4, wherein the upper idler wheel mechanism comprises an upper idler wheel support, a plurality of upper wheel axles and a plurality of upper idler wheels, the upper idler wheel support comprises an upper cylinder and a plurality of upper supports, the upper idler wheel support is of an integral structure, the upper cylinder is fixedly sleeved on the guide rod, one end of each upper support is arranged at the lower part of the upper cylinder, the corresponding upper wheel axle is installed at the other end of each upper support, the corresponding upper idler wheel is installed on each upper wheel axle, and each upper idler wheel is in contact with the upper surface of the corresponding rigid plate; the lower idler wheel mechanism comprises a lower idler wheel support, a plurality of lower wheel axles and a plurality of lower idler wheels, the lower idler wheel support comprises a lower cylinder and a plurality of lower supports, the lower idler wheel support is of an integral structure, the lower cylinder is fixedly sleeved on the guide rod, one end of each lower support is arranged at the upper part of the lower cylinder, the corresponding lower wheel axle is installed at the other end of each lower support, the corresponding lower idler wheel is installed on each lower wheel axle, and each lower idler wheel is in contact with the lower surface of the corresponding rigid plate.

6. The piezoelectric self-powered combination beam vibration damper according to claim 1, wherein the upper guiding component and the lower guiding component are linear bearings respectively.

7. The piezoelectric self-powered combination beam vibration damper according to claim 1, wherein the upper elastic component and the lower elastic component are reset springs respectively.

8. A control method of the piezoelectric self-powered combination beam vibration damper according to claim 1, wherein the control method comprises the following steps:

energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, wherein the piezoelectric cantilever beams connected with the input end of the circuit system are used for energy collection, the piezoelectric cantilever beams connected with the output end of the circuit system are used for vibration control, when the voltage generated by the piezoelectric cantilever beams used for energy collection reaches a maximum value or a minimal value, the circuit system is conducted, and the energy stored by the circuit system is used for vibration control of the piezoelectric cantilever beams connected with the output end of the circuit system.

9. A control method of the piezoelectric self-powered combination beam vibration damper according to claim 2, wherein the control method comprises the following steps: energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, wherein the piezoelectric cantilever beams connected with the input end of the circuit system are used for energy collection, the piezoelectric cantilever beams connected with the output end of the circuit system are used for vibration control, when the voltage generated by the piezoelectric cantilever beams used for energy collection reaches a maximum value or a minimal value, the circuit system is conducted, and the energy stored by the circuit system is used for vibration control of the piezoelectric cantilever beams connected with the output end of the circuit system.

10. A control method of the piezoelectric self-powered combination beam vibration damper according to claim 4, wherein the control method comprises the following steps: energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, wherein the piezoelectric cantilever beams connected with the input end of the circuit system are used for energy collection, the piezoelectric cantilever beams connected with the output end of the circuit system are used for vibration control, when the voltage generated by the piezoelectric cantilever beams used for energy collection reaches a maximum value or a minimal value, the circuit system is conducted, and the energy stored by the circuit system is used for vibration control of the piezoelectric cantilever beams connected with the output end of the circuit system.

11. A control method of the piezoelectric self-powered combination beam vibration damper according to claim 6, wherein the control method comprises the following steps: energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, wherein the piezoelectric cantilever beams connected with the input end of the circuit system are used for energy collection, the piezoelectric cantilever beams connected with the output end of the circuit system are used for vibration control, when the voltage generated by the piezoelectric cantilever beams used for energy collection reaches a maximum value or a minimal value, the circuit system is conducted, and the energy stored by the circuit system is used for vibration control of the piezoelectric cantilever beams connected with the output end of the circuit system.

12. A control method of the piezoelectric self-powered combination beam vibration damper according to claim 8, wherein the control method comprises the following steps: energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, wherein the piezoelectric cantilever beams connected with the input end of the circuit system are used for energy collection, the piezoelectric cantilever beams connected with the output end of the circuit system are used for vibration control, when the voltage generated by the piezoelectric cantilever beams used for energy collection reaches a maximum value or a minimal value, the circuit system is conducted, and the energy stored by the circuit system is used for vibration control of the piezoelectric cantilever beams connected with the output end of the circuit system.

13. A control method of the piezoelectric self-powered combination beam vibration damper according to claim 10, wherein the control method comprises the following steps: energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, wherein the piezoelectric cantilever beams connected with the input end of the circuit system are used for energy collection, the piezoelectric cantilever beams connected with the output end of the circuit system are used for vibration control, when the voltage wherein the piezoelectric cantilever beams used for energy collection reaches a maximum value or a minimal value, and using the energy stored by the circuit system for vibration control of the piezoelectric cantilever beams connected with the output end of the circuit system.

14. A control method of the piezoelectric self-powered combination beam vibration damper according to claim 12, wherein the control method comprises the following steps: energy is input to the system when the loading platform is excited by an external environment, the energy is transferred to the upper idler wheel mechanism and the lower idler wheel mechanism through the guide rod, and then the energy is transferred to the piezoelectric cantilever beams, the piezoelectric cantilever beams are forced to be vibrated and electric charges are generated due to a piezoelectric effect, wherein the piezoelectric cantilever beams connected with the input end of the circuit system are used for energy collection, the piezoelectric cantilever beams connected with the output end of the circuit system are used for vibration control, when the voltage generated by the piezoelectric cantilever beams used for energy collection reaches a maximum value or a minimal value, the circuit system is conducted, and the energy stored by the circuit system is used for vibration control of the piezoelectric cantilever beams connected with the output end of the circuit system.

* * * * *